(12) United States Patent
Grosser et al.

(10) Patent No.: US 7,343,507 B2
(45) Date of Patent: Mar. 11, 2008

(54) INPUT CIRCUIT AND METHOD FOR THE OPERATION THEREOF

(75) Inventors: Stefan Grosser, Schnaittenbach (DE); Mario Maier, Ensdorf (DE); Reinhard Mark, Hersbruck (DE); Monika Singer, Greenville, SC (US)

(73) Assignee: Siemens Aktiengesellschaft, Munich (DE)

( * ) Notice: Subject to any disclaimer, the term of this patent is extended or adjusted under 35 U.S.C. 154(b) by 629 days.

(21) Appl. No.: 10/885,412

(22) Filed: Jul. 7, 2004

(65) Prior Publication Data
US 2005/0030682 A1    Feb. 10, 2005

Related U.S. Application Data

(63) Continuation of application No. PCT/DE02/04710, filed on Dec. 23, 2002.

(30) Foreign Application Priority Data
Jan. 7, 2002    (DE) ................. 102 00 276

(51) Int. Cl.
*G06F 1/12*    (2006.01)
(52) U.S. Cl. ............ 713/401; 327/276; 327/261
(58) Field of Classification Search ............ 713/401; 327/276, 261
See application file for complete search history.

(56) References Cited

U.S. PATENT DOCUMENTS

| 4,825,109 | A | * | 4/1989 | Reynolds | 327/271 |
| 5,754,071 | A | * | 5/1998 | Suh | 327/279 |
| 5,789,969 | A | * | 8/1998 | Davis et al. | 327/276 |
| 6,137,333 | A | * | 10/2000 | Williams et al. | 327/261 |
| 6,225,840 | B1 | * | 5/2001 | Ishimi | 327/116 |
| 6,405,228 | B1 | * | 6/2002 | Williams et al. | 708/300 |

FOREIGN PATENT DOCUMENTS

EP    0 556 549 A1    8/1993

* cited by examiner

*Primary Examiner*—Chun Cao
*Assistant Examiner*—Vincent T Tran
(74) *Attorney, Agent, or Firm*—Sughrue Mion, PLLC

(57) ABSTRACT

An input circuit (1') provided with a time delay element (40), which circuit is capable of being tested by a controlled high level or low level connection, and a method for the operation thereof. The delay time of the time-delay element can be modified during operation of the input circuit. In particular, the elapsed delay time is read out prior to the testing of the input circuit and is restored again after testing, so that the test does not increase the effective input delay time for the process signals. In addition or as an alternative, the delay time is set to a minimum value prior to the test to enable rapid testing of the input circuit independent of the set delay time.

17 Claims, 2 Drawing Sheets

1'    Input Circuit
3    Voltage Divider
4    RC Element
5    Control Device
40    Function Block
41    Counter 1   Input Circuit
3   Voltage Divider
4   RC Element
5   Control Device
8   1st Actuatable Switch
9   2nd Actuatable Switch 1' Input Circuit
3 Voltage Divider
4 RC Element
5 Control Device
40 Function Block
41 Counter

INPUT CIRCUIT AND METHOD FOR THE OPERATION THEREOF

This is a Continuation of International Application PCT/DE02/04710, with an international filing date of Dec. 23, 2002, which was published under PCT Article 21(2) in German, and the disclosure of which is incorporated into this application in its entirety by reference.

BACKGROUND OF THE INVENTION

The invention relates to an input circuit and a method for its operation, wherein the input delay of a time delay element of the input circuit can be modified during operation of the input circuit.

An input circuit of the generic type and a corresponding operating method are known in the art. The prior-art input circuit has an input, a voltage divider with a center tap, a time-delay element, a control device and means for the high and/or low level connection. A first pole of the voltage divider forms the input of the input circuit. A signal input of the time delay element is located at the center tap of the voltage divider, and an output of the time delay element is connected to the control device. The means for the high level and low level connection are controlled by the control device and act on the signal input.

The signal applied to the input of the input circuit is hereinafter referred to as the process signal. It is supplied, for example, by a limit switch of a technical process. The input circuit is thus provided to receive digital or analog signals from a technical process controlled and/or monitored, for example, by an automation device such as a programmable controller. The input circuit can be integrated into an input module, which can be combined, particularly in a modular type of construction, with a central processing unit of the programmable controller.

The time-delay element used in the prior-art input circuit is an RC element. The delay time is determined by the dimensioning of the resistor/capacitor combination of the RC element. The high level and low level connection is provided to test the input circuit. When the high level connection is activated, a defined high signal based on a reference potential is applied to the signal input, and when the low level connection is activated, a defined low signal based on the ground potential is applied to the signal input.

One disadvantage of this prior-art input circuit and the corresponding operating method, however, is that the delay time, which is also referred to as the input delay, is constant.

Thus, one object of the present invention is to provide an input circuit and a method for its operation, such that the input delay of the time delay element can be modified during operation of the input circuit.

SUMMARY OF THE INVENTION

This and other objects of the invention with respect to the input circuit are attained in an exemplary embodiment by a control device connected to the time delay element by a clock line, such that the delay time of the time delay element can be influenced by means of a clock signal transmitted over the clock line. Accordingly, one advantage of the invention is that the variable delay time can be used to adapt the behavior of the input ircuit to changing requirements.

The object of the invention with respect to an exemplary method for operating the input circuit is attained by having a clock signal transmitted via a clock line, which connects the control device with the time delay element, and having the clock signal influence the delay time of the time delay element.

The invention is based on the finding that a time delay element can also be implemented using a suitable digital filter. Both the digital filter and the RC element are functional components with delay characteristics. Whereas the delay time in the RC element can be achieved only by changing the characteristics of the resistor/capacitor combination, hence by changing these components, the delay time in the digital filter can be changed at any time, e.g., by modifying the internal parameters.

In the present invention, if the clock signal transmitted via the clock line acts on a counter of the time delay element and the delay time of the time delay element is determined by the expiration of the counter, then the delay time is determined not only by the period of the clock signal, but by the counter itself. This provides a particularly simple means to influence the delay time. For a counter with a width of, for example, seven bits, which can accordingly count 64 pulses, the desired delay time can be obtained by adjusting the period of the clock signal based on the formula "delay time=64× period."

Further flexibility in specifying the delay time is obtained if a start value or threshold value of the counter is predefined or predefinable. The start value or threshold value is the value from which the counter counts down to zero (start value) or up to which the counter counts starting from zero (threshold value). In a decrementing counter, which counts from the start value back to zero, the start value is modified to influence the delay time. In an incrementing counter, which counts from zero to the threshold value, the threshold value is modified to influence the delay time. The higher the start value or the threshold value is selected, the longer the delay time. The ability to influence the start value or the threshold value is useful, for example, if a particularly short delay time is to be specified, which cannot be achieved simply by an upper limit frequency of the clock signal.

According to another embodiment of the input circuit and the method for its operation, the control device is also connected to the time delay element via a write line and a read line, and via a data bus. As a result, the control device can read out the already elapsed delay time via the read line and the data bus prior to the activation of one of the means for the high level or low level connection, and after terminating the activation of one of the means for the high level or low level connection, it can restore the read, elapsed delay time in the time delay element via the write line and the data bus.

This has the advantageous effect that after testing of the input circuit through the high level or low level connection, the full delay time does not need to elapse again before a response to a change in the process signal is possible.

Advantageously, the control device reads out the already elapsed delay time directly from the counter of the time delay element and restores the read, elapsed delay time directly in the counter of the time delay element. This prevents, on the one hand, for example, the need for a separate counter to record the number of the clock signal pulses on the side of the control device and ensures, on the other hand, a rapid restoration of the elapsed delay time, which could otherwise be achieved, for example, through a brief increase in the clock frequency.

In the described input circuit and the corresponding method for its operation, the defined high level or low level signal, hereinafter together referred to as the test signal, is still subject to the delay time, defined by the time delay element, during testing, which is a disadvantage. For a delay time of, e.g., 3 ms, the test signal, e.g., must be applied to the signal input for at least 3 ms in order to be forwarded to the control device. During this time, it is not possible to detect which process signal is present at the input of the input circuit. As a result, a response to a change in the process signal can occur only after the test signal has been removed and after any remaining delay time has elapsed. If a full test of the input circuit is done with the high level and low level connection and the process signal changes at the beginning of the test, no response to the signal change is possible for a period of three times the delay time.

The invention advantageously further provides that a predefinable or predefined minimum delay time is set after the already elapsed delay time has been read out. As a result, the pulse applied to the signal input is subject only to a minimum delay through the high level or low level connection. The testing of the input circuit can thus be substantially accelerated. The time gain corresponds to at least the difference between the delay time of the time delay element in normal operation and the minimum delay time during the high level or low level connection.

Thus, for the testing of the input circuit, the control device can determine almost immediately whether the desired conditions, which are defined by activating the high level or low level connection, are established at the output of the time delay element.

The minimum delay time is advantageously set by reducing the period of the clock signal transmitted via the clock line.

In addition, or as an alternative, the minimum delay time can be set by suitably influencing the counter, particularly by reducing its start value or threshold value. For this purpose, the counter or its parameters are influenced via the data bus after the write line has been activated. In addition to reducing the start value or threshold value, it may also be provided that the current status of the counter is set to a value just below the start value or threshold value, such that the minimum delay time is obtained, and the counter expires as a result when the start value or threshold value is reached with the subsequent pulses of the clock signal.

These and other objects, features, aspects and advantages of the present invention will become more apparent from the following detailed description of the exemplary embodiments in view of the accompanying drawings.

DETAILED DESCRIPTION OF THE INVENTION

Figure 1:
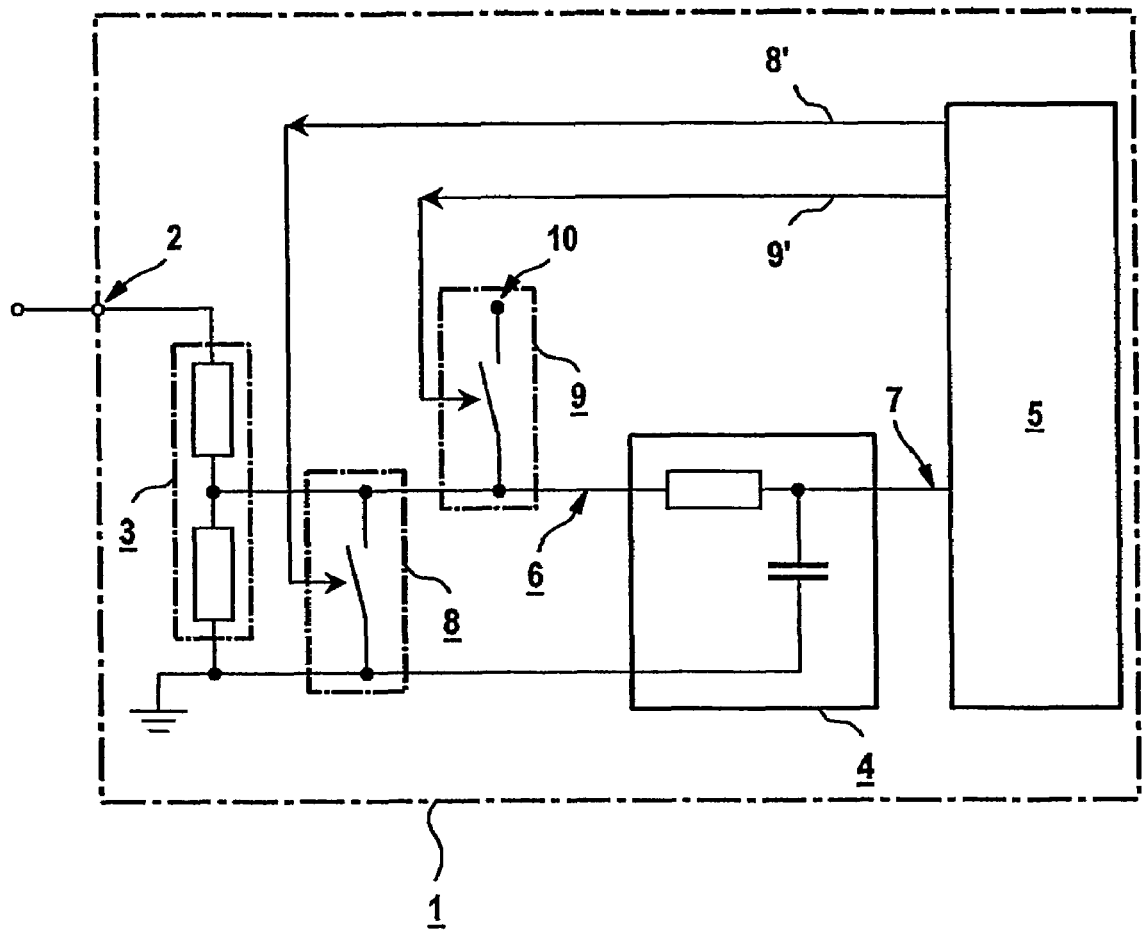
FIG. 1 shows a schematic diagram of a testable input circuit according to the prior art.

FIG. 1 shows a schematic diagram of a testable input circuit 1 according to the prior art with an input 2 to which an input signal can be applied. The input signal applied to the input 2, is referred to as a process signal. It is supplied, for example, by a limit switch or a control element (not depicted) of a technical process (likewise not depicted).

The input circuit 1 has a voltage divider 3 with a center tap, a time delay element in the form of an RC element 4, and a control device 5. For practical applications, the input circuit is implemented multiple times, such that the control device 5 can monitor and evaluate, for example, eight, sixteen or more inputs.

The input 2 forms one of the two poles of the voltage divider 3. The other pole of the voltage divider 3 is connected to ground. One of the two inputs of the RC element 4 is likewise connected to ground. The other input of the RC element 4, which is referred to as the signal input 6, is connected to the center tap of the voltage divider 3. The RC element 4 has an output 7. This output is supplied to the control device 5. Depending on the dimensioning of the resistor/capacitor combination, the RC element 4 causes a delay of the effect of the pulses at the signal input 6 on the output 7. Only pulses which are applied to the signal input 6 effected by the RC element 4 during a full delay time reach the output 7 and thus the control device 5. The dimensioning of the RC element 4 determines the delay time. To operate the input circuit 1 with a different delay time, the RC element 4 acting as the time delay element 4 must be exchanged, or its resistor/capacitor combination must be modified.

To test the input circuit 1, first and second electrically actuatable switches 8, 9 are provided. The first electrically actuatable switch 8, the low level connection, is connected to ground with one pole and to the signal input 6 of the RC element 4 with the other pole. It can be activated using a first control line 8' of the control device 5. The second electrically actuatable switch 9, the high level connection, is connected to a reference potential 10 with one pole and to the signal input 6 of the RC element 4 with the other pole. It can be activated by means of a second control line 9' of the control device 5.

To test the input circuit 1, the control device 5 activates one of the electrically actuatable switches 8, 9 in a predefined or predefinable sequence via one of the control lines 8', 9'. If the low level connection is activated, the switch 8 is closed and the signal input 6 is thereby connected to the ground potential. When the high level connection is activated, the switch 9 is closed and the signal input 6 is thereby connected to the reference potential 10. This makes it possible to predetermine defined conditions at the signal input 6 through the control device 5. The signal input 6 is forwarded to the control device 5 via the RC element 4 and the output 7. Thus, the control device 5 can be used to check whether an input signal corresponding to the defined conditions predetermined by the high level or low level connection is being read. If this is the case, the input circuit 1 is considered to be functioning properly. If not, the input circuit 1 is considered faulty. In the latter case, the control device 5 can then indicate the faultiness of the input circuit 1 by a corresponding signal (not depicted).

The input circuit 1 has three distinct operating states, i.e., normal operation, high-test, and low-test. High-test and low-test are referred to as the test mode.

In normal operation, the switch 8 of the low level connection and the switch 9 of the high level connection are open. The process signal at the input 2 acts on the RC element 4 via the voltage divider 3 and the signal input 6. After elapse of the delay time of, e.g., 3 ms defined by the RC element 4, the process signal reaches the output 7 and thus the control device 5.

The description of the test mode, given by way of the high-test example, additionally considers the times that elapse for a time delay of the RC element 4 of, e.g., 3 ms before there can be a response to the process signal:

t=0.0 ms: the process signal at the input 2 changes.

t=2.9 ms: the control device 5 starts the high-test of the input circuit 1. The switch 9 of the high level connection 9 is closed via the control line 9'. The reference potential 10 is acting on the signal input 6.

t=5.9 ms: after elapse of the predefined delay time of 3 ms, the function block 5 detects the expect signal at the output 7 of the RC element 4 if the input circuit 1 is functioning properly.

t=6.0 ms: the function block 5 terminates the high-test. The high level connection 9 is switched inactive by opening the switch 9. The process signal is acting again on the signal input 6.

t=9.0 ms: after renewed elapse of the predefined delay time of 3 ms, the function block 5 detects the status of the process signal.

The time conditions during the low-test correspond to those during the high-test.

Thus, the test of the input circuit 1 increases the time to the response to a change in the process signal by at least the duration of the delay time during the high-test. Furthermore, the time of the response to a change in the process signal is increased by the elapse of the delay time before and after the high-test. In the least favorable case, the times add up in such a way that, during a three-fold delay time, a response to a change in the process signal is no longer possible. The test has increased the input delay for the process signal by 6 ms.

Figure 2:
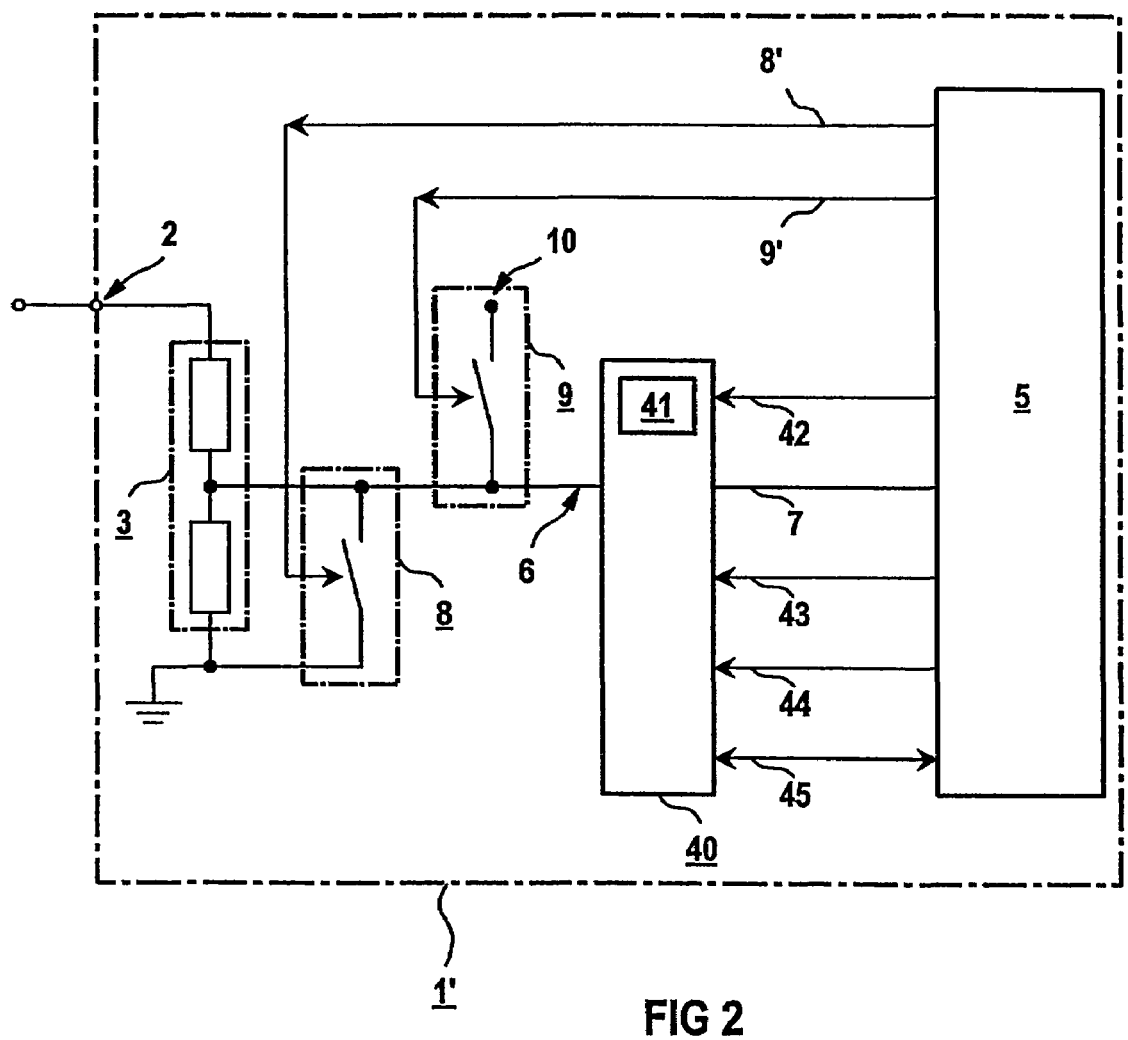
FIG. 2 shows a schematic diagram of an exemplary embodiment of an input circuit according to the invention.

FIG. 2 shows a schematic diagram of an exemplary embodiment of an input circuit 1' according to the invention. For purposes of understanding, corresponding items or elements are provided with the same reference numbers as in FIG. 1. The input circuit 1' is distinguished from the prior-art input circuit 1 depicted in FIG. 1 in that a function block 40 with a counter 41 is provided as the time delay element 40 instead of the RC element 4 (FIG. 1). The functionality of the input circuit 1' corresponds to that of the input circuit 1 depicted in FIG. 1.

In particular, the function block 40 is a highly integrated programmable logic device 40 with delay characteristics. The function block 40, like the RC element 4 (FIG. 1) is supplied with the process signal at its signal input 6 when the high level and low level connection is not activated. After the elapse of the delay time of the function block 40, this signal is forwarded to the control device 5 via the output 7.

To enable the control device 5 to control and monitor the function block 40, a clock line 42, a write line 43 and a read line 44, and a data bus 45 are provided.

With the function block 40, a digital time delay element is realized. Its delay time is determined by the period of a clock signal applied to the counter 41 and transmitted via the clock line 42 and a predefined or predefinable start value or threshold value, together referred to as the "factor." As a result, the delay time is determined based on the formula "delay time=factor×period of the clock signal," where the "factor" in particular represents a natural number, e.g., 64. The counter 41 simulates the integrating function of an RC element. The status of the counter 41 is a measure of the already elapsed time.

After elapse of the delay time, the signal applied to the signal input 6 is forwarded to the control device 5 via the output 7. Pulses at the signal input 6, which are shorter than the set delay time, are suppressed and thus do not reach the output 7 or the control device 5.

The status of the counter 41 can be read by activating the read line 44 on the data bus 45. By activating the write line 43 the control device 5 can change the status of the counter 41 in a defined manner via the data bus 45.

The input circuit 1' again has the three distinct operating states, i.e., normal operation, high-test, and low-test.

In normal operation, the switch 8 of the low level connection and the switch 9 of the high-level connection are open. The process signal at the input 2 acts on the time delay element 40 via the voltage divider 3 and the signal input 6. After elapse of the delay time of, for example, 3 ms, which is defined by the time delay element 40, the process signal reaches the output 7 and thus the control device 5.

The description of the test mode, again given by way of the example of the high-test, additionally considers the times that elapse with a delay time of the time delay element 40 of, e.g., 3 ms before there can be a response to a change in the process signal:

t=0.0 ms: the process signal at the input 2 changes.

t=2.9 ms: the function block 5 starts the high-test of the input circuit 1'.

For this purpose the control device 5 reads out and stores the status of the counter 41. The status of the incrementing counter 41 is set to the value "0." Furthermore, the switch 9 of the high level circuit 9 is closed via the control line 9'. The reference potential 10 is acting on the signal input 6. The control device 5 defines a clock signal with the maximum output frequency at the clock line 42.

t=2.9 ms+δt: when the threshold value of the incrementing counter 41 is reached, the connected high level must be present at the output 7 if the input circuit 1' is functioning properly. The function block 5 terminates the high-test. The high level connection 9 is switched to inactive by opening the switch 9. The process signal acts again on the signal input 6. Finally, the control device 5 restores the initially read status of the counter 41.

t≈3.0 ms: the process signal is acting on the input 2.

t≈3.1 ms: after elapse of the full predefined delay time of 3 ms (2.9 ms before the high-test and 0.1 ms after the high-test), the function block 5 detects the status of the process signal.

Here, too, the time conditions during the low-test correspond to those during the high-test.

Thus, in the least favorable case, i.e., if the test is started immediately prior to the elapse of the delay time in normal operation, the response to a change in the process signal is approximately 3.1 ms. The test increased the input delay by only approximately 0.1 ms.

Compared to the input circuit according to FIG. 1, this results in a substantially improved response time to a change in the process signal. This is due to the fact that the delay time, which already elapsed before the test mode was started, is not "lost" but is stored by reading out the status of the counter and only a minimum delay time, which results from the influence of the clock signal, acts during the test mode.

Thus, the invention and advantageous embodiments thereof may include in exemplary embodiments such as:

An input circuit (1') provided with a time delay element (40), which circuit is capable of being tested by a controlled high level or low level connection, and a method for the operation thereof are disclosed. The delay time of the time-delay element (40) can be modified during operation of the input circuit (1'). According to one embodiment, the elapsed delay time is read out prior to the testing of the input circuit 1' and is restored again after testing, such that the test does not increase the effective input delay time for the process signals. Furthermore, in addition or as an alternative, the delay time is set to a minimum value prior to the test to enable rapid testing of the input circuit (1') independent of the set delay time.

It will be apparent to those skilled in the art that various modifications and variations can be made to the described exemplary embodiments of the present invention without departing from the spirit or scope of the invention. Thus, it is intended that the present invention cover all modifications and variations of this invention consistent with the scope of the appended claims and their equivalents.

What is claimed is:

1. An input circuit comprising:
   an input;
   a voltage divider with a center tap;
   a time delay element;
   a control device; and
   means for high level and low level connection,
   wherein a first pole of the voltage divider forms the input of the input circuit, a signal input of the time delay element is located at the center tap of the voltage divider, and an output of the time delay element is connected to the control device,
   wherein the means for the high level and low level connection are controlled by the control device and act on the signal input, the control device is connected to the time delay element via a clock line, and a delay time of the time delay element is influenced by means of a clock signal that is transmitted via the clock line,
   wherein the clock signal transmitted via the clock line acts on a counter of the time delay element, and the delay time of the time delay element is determined by the expiration of the counter, and
   wherein a start value or threshold value of the counter is predefined.

2. An input circuit comprising:
   an input;
   a voltage divider with a center tap;
   a time delay element;
   a control device; and
   means for high level and low level connection,
   wherein a first pole of the voltage divider forms the input of the input circuit, a signal input of the time delay element is located at the center tap of the voltage divider, and an output of the time delay element is connected to the control device,
   wherein the means for the high level and low level connection are controlled by the control device and act on the signal input, the control device is connected to the time delay element via a clock line, and a delay time of the time delay element is influenced by means of a clock signal that is transmitted via the clock line, and
   wherein the control device is further connected to the time delay element via a read line and a write line, and via a data bus, and
   wherein the control device, prior to activating one of the means for the high level or low level connection, reads out the already elapsed delay time from the time delay element via the read line and the data bus, and after terminating the activation of the one of the means for the high level or low level connection, restores the read, elapsed delay time in the time delay element via the write line and the data bus.

3. An input circuit comprising:
   an input;
   a voltage divider with a center tap;
   a time delay element;
   a control device; and
   means for high level and low level connection,
   wherein a first pole of the voltage divider forms the input of the input circuit, a signal input of the time delay element is located at the center tap of the voltage divider, and an output of the time delay element is connected to the control device,
   wherein the means for the high level and low level connection are controlled by the control device and act on the signal input, the control device is connected to the time delay element via a clock line, and a delay time of the time delay element is influenced by means of a clock signal that is transmitted via the clock line,
   wherein the clock signal transmitted via the clock line acts on a counter of the time delay element, and the delay time of the time delay element is determined by the expiration of the counter, and
   wherein the control device reads out the already elapsed delay time from the counter of the time delay element and restores the read, elapsed delay time in the counter of the time delay element.

4. An input circuit comprising:
   an input;
   a voltage divider with a center tap;
   a time delay element;
   a control device; and
   at least one switch,
   wherein a first pole of the voltage divider forms the input of the input circuit, a signal input of the time delay element is located at the center tap of the voltage divider, and an output of the time delay element is connected to the control device,
   wherein the at least one switch is controlled by the control device and acts on the signal input, the control device is connected to the time delay element via a clock line, and a delay time of the time delay element is influenced by a clock signal transmitted via the clock line,
   wherein the control device is further connected to the time delay element via a read line and a write line, and via a data bus, and
   wherein the control device, prior to activating one of the at least one switch, reads out the already elapsed delay time from the time delay element via the read line and the data bus, and after terminating the activation of the one of the at least one switch, restores the read, elapsed delay time in the time delay element via the write line and the data bus.

5. The input circuit as claimed in claim 4, wherein the clock signal transmitted via the clock line acts on a counter of the time delay element, and the delay time of the time delay element is determined by the expiration of the counter, and wherein a start value or threshold value of the counter is predefined.

6. A method for operating an input circuit, the input circuit having an input, a voltage divider with a center tap, a time delay element, a control device, and means for the high level and low level connection,
   wherein a first pole of the voltage divider forms the input of the input circuit,
   a signal input of the time delay element is located at the center tap of the voltage divider and an output of the time delay element is connected to the control device, and
   the means for the high level and low level connection are controlled by the control device and act on the signal input, the method comprising:
   transmitting a clock signal via a clock line, which connects the control device to the time delay element, wherein the clock signal influences a delay time of the time delay element,
   wherein the clock signal transmitted via the clock line acts on a counter of the time delay element, and the delay time of the time delay element is determined by an expiration of the counter, and wherein a start value or threshold value of the counter is predefined.

7. A method for operating an input circuit, the input circuit having an input, a voltage divider with a center tap, a time delay element, a control device, and means for the high level and low level connection, wherein a first pole of the voltage divider forms the input of the input circuit, a signal input of the time delay element is located at the center tap of the voltage divider and an output of the time delay element is connected to the control device, and the means for the high level and low level connection are controlled by the control device and act on the signal input, the method comprising:

transmitting a clock signal via a clock line, which connects the control device to the time delay element, wherein the clock signal influences a delay time of the time delay element, wherein the control device is further connected to the time delay element via a write line and a read line and a data bus, and wherein the control device, via the read line and the data bus, prior to the activation of one of the means for the high level or low level connection reads out the already elapsed delay time and, after terminating the activation of one of the means for the high level or low level connection, restores the read, elapsed delay time in the time delay element via the write line and the data bus.

8. The method as claimed in claim 7, wherein, after the read-out of the already elapsed delay time, a predefinable or predefined minimum delay time is set.

9. The method as claimed in claim 8, wherein the setting of the minimum delay time is achieved by reducing the period of the clock signal transmitted via the clock line.

10. The method as claimed in claim 8, wherein the setting of the minimum delay time is achieved by reducing the start value or the threshold value of the counter.

11. The method as claimed in claim 8, wherein the setting of the minimum delay time is achieved by influencing the current counter status.

12. The method as claimed in claim 7, wherein the control device reads out the already elapsed delay time from the counter of the time delay element and restores the read out, elapsed delay time in the counter of the time delay element.

13. A method for operating an input circuit, the input circuit having an input, a voltage divider with a center tap, a time delay element, a control device, and means for the high level and low level connection, wherein a first pole of the voltage divider forms the input of the input circuit, a signal input of the time delay element is located at the center tap of the voltage divider and an output of the time delay element is connected to the control device, and the means for the high level and low level connection are controlled by the control device and act on the signal input, the method comprising:

transmitting a clock signal via a clock line, which connects the control device to the time delay element, wherein the clock signal influences a delay time of the time delay element, wherein the clock signal transmitted via the clock line acts on a counter of the time delay element, and the delay time of the time delay element is determined by an expiration of the counter, and wherein the control device reads out the already elapsed delay time from the counter of the time delay element and restores the read out, elapsed delay time in the counter of the time delay element.

14. The method as claimed in claim 13, wherein, after the read-out of the already elapsed delay time, a predefinable or predefined minimum delay time is set.

15. The method as claimed in claim 14, wherein the setting of the minimum delay time is achieved by reducing the period of the clock signal transmitted via the clock line.

16. The method as claimed in claim 14, wherein the setting of the minimum delay time is achieved by reducing the start value or the threshold value of the counter.

17. The method as claimed in claim 14, wherein the setting of the minimum delay time is achieved by influencing the current counter status.

* * * * *